US008649756B2

(12) United States Patent
Helm

(10) Patent No.: US 8,649,756 B2
(45) Date of Patent: Feb. 11, 2014

(54) SYSTEMS AND METHODS FOR PROVIDING ABBREVIATED ELECTRONIC PROGRAM GUIDES

(75) Inventor: Sean L. Helm, Saline, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 20 days.

(21) Appl. No.: 13/444,386

(22) Filed: Apr. 11, 2012

(65) Prior Publication Data

US 2013/0273864 A1 Oct. 17, 2013

(51) Int. Cl.
*H05K 11/02* (2006.01)

(52) U.S. Cl.
USPC .......................................... 455/345; 725/44

(58) Field of Classification Search
USPC ..................... 455/230, 344, 345; 725/39, 44
See application file for complete search history.

(56) References Cited

U.S. PATENT DOCUMENTS

| | | | | |
|---|---|---|---|---|
| 8,010,136 | B2 | 8/2011 | MacDonald et al. | |
| 2003/0144012 | A1* | 7/2003 | Kimura | 455/456 |
| 2005/0273233 | A1 | 12/2005 | Sekine | |
| 2008/0032721 | A1* | 2/2008 | MacDonald et al. | 455/466 |
| 2008/0148313 | A1* | 6/2008 | Ozawa et al. | 725/39 |
| 2009/0083802 | A1* | 3/2009 | Kohno et al. | 725/59 |
| 2010/0056195 | A1* | 3/2010 | Nixon | 455/518 |
| 2010/0251283 | A1 | 9/2010 | Smith | |
| 2010/0257475 | A1 | 10/2010 | Smith et al. | |
| 2010/0287588 | A1 | 11/2010 | Cox et al. | |
| 2011/0145863 | A1* | 6/2011 | Alsina et al. | 725/44 |

FOREIGN PATENT DOCUMENTS

| | | |
|---|---|---|
| WO | 2010118296 | 10/2010 |

* cited by examiner

*Primary Examiner* — Nguyen Vo
(74) *Attorney, Agent, or Firm* — Dinsmore & Shohl

(57) ABSTRACT

Systems and methods for providing an abbreviated electronic program guide are provided. Some embodiments include receiving a radio signal that includes an audio content portion and an auxiliary information display portion, determining whether the vehicle is in operation, and in response to determining that the vehicle is not in operation, providing the auxiliary information display portion for display in the vehicle. In response to determining that the vehicle is in operation, some embodiments may be configured to create an altered auxiliary information by removing content from the auxiliary information display portion, provide the audio content portion for playback in the vehicle, and provide the altered auxiliary information for display in the vehicle, wherein the altered auxiliary information includes only a subset of features from the auxiliary information display portion.

15 Claims, 11 Drawing Sheets

SYSTEMS AND METHODS FOR PROVIDING ABBREVIATED ELECTRONIC PROGRAM GUIDES

TECHNICAL FIELD

Embodiments described herein generally relate to systems and methods for providing an abbreviated program guide and, more specifically, to detecting vehicle operation for providing the abbreviated program guide.

BACKGROUND

As vehicle options become more robust and complex, vehicle users are often presented with user options. As an example, many current vehicles are equipped with an electronic program guide (EPG) that may provide navigation controls, audio options, video options, vehicle options, etc. In response to selection of one or more of these options, content may be provided in the form of radio broadcasts, video broadcasts, and navigation commands, among others. Thus, there is a desire to reduce and/or streamline the options presented to vehicle users.

SUMMARY

Systems and methods for providing an abbreviated electronic guide are described. Some embodiments include receiving a radio signal that includes an audio content portion and an auxiliary information display portion, determining whether the vehicle is in operation, and in response to determining that the vehicle is not in operation, providing the auxiliary information display portion for display in the vehicle. In response to determining that the vehicle is in operation, some embodiments may be configured to create an altered auxiliary information by removing content from the auxiliary information display portion, provide the audio content portion for playback in the vehicle, and provide the altered auxiliary information for display in the vehicle, wherein the altered auxiliary information includes a subset of features from the auxiliary information display portion.

In another embodiment, a system for providing an abbreviated electronic program guide includes memory component that stores logic that causes the system to receive a media signal at a vehicle, determine whether the vehicle is in operation, and in response to determining that the vehicle is not in operation, provide the audio content portion for playback in the vehicle and provide the auxiliary information display portion for display in the vehicle. In response to determining that the vehicle is in operation, some embodiments are configured to create altered auxiliary information by removing content from the auxiliary information display portion, provide the audio content portion for playback in the vehicle, and provide the altered auxiliary information for display.

In yet another embodiment, a vehicle includes a vehicle computing device that stores logic that causes the vehicle computing device to receive a media signal, the media signal including an audio content portion and an auxiliary information display portion, and determine whether the vehicle is in operation. In response to determining that the vehicle is in operation, the vehicle computing device may create altered auxiliary information by removing content from the auxiliary information display portion, provide the audio content portion for playback in the vehicle, and provide the altered auxiliary information for display.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which.

DETAILED DESCRIPTION

Embodiments disclosed herein include systems and methods for providing an abbreviated electronic program guide (EPG). The systems and methods may be configured to determine a current state of the vehicle. If the vehicle is in a non-operational state, a fully functional EPG may be provided. The fully functional EPG may provide all available options to the user. By contrast, if the vehicle is in an operational state, an abbreviated EPG may be provided, with corresponding abbreviated in-vehicle user interfaces. The abbreviated EPG may be configured to be a streamlined version of the fully functional EPG with fewer options than the fully functional EPG.

Specifically, embodiments described herein offer an EPG for providing one or more in-vehicle user interfaces to a user.

The EPG may provide options related to the playback of stored and/or received media. The stored media may include content stored on a compact disc, digital video disc, and/or hard drive. The received data may include terrestrial radio, satellite radio, and/or internet content. In one embodiment, an EPG is provided when the vehicle is not in operation that enables selection of content to be played at a predetermined future time. When the vehicle is in operation, an abbreviated EPG may be provided to the user. The abbreviated EPG may prevent the user from manually selecting the desired source and/or content to view. However, the preselected content may be automatically accessed, when the scheduled time arrives.

Figure 1:
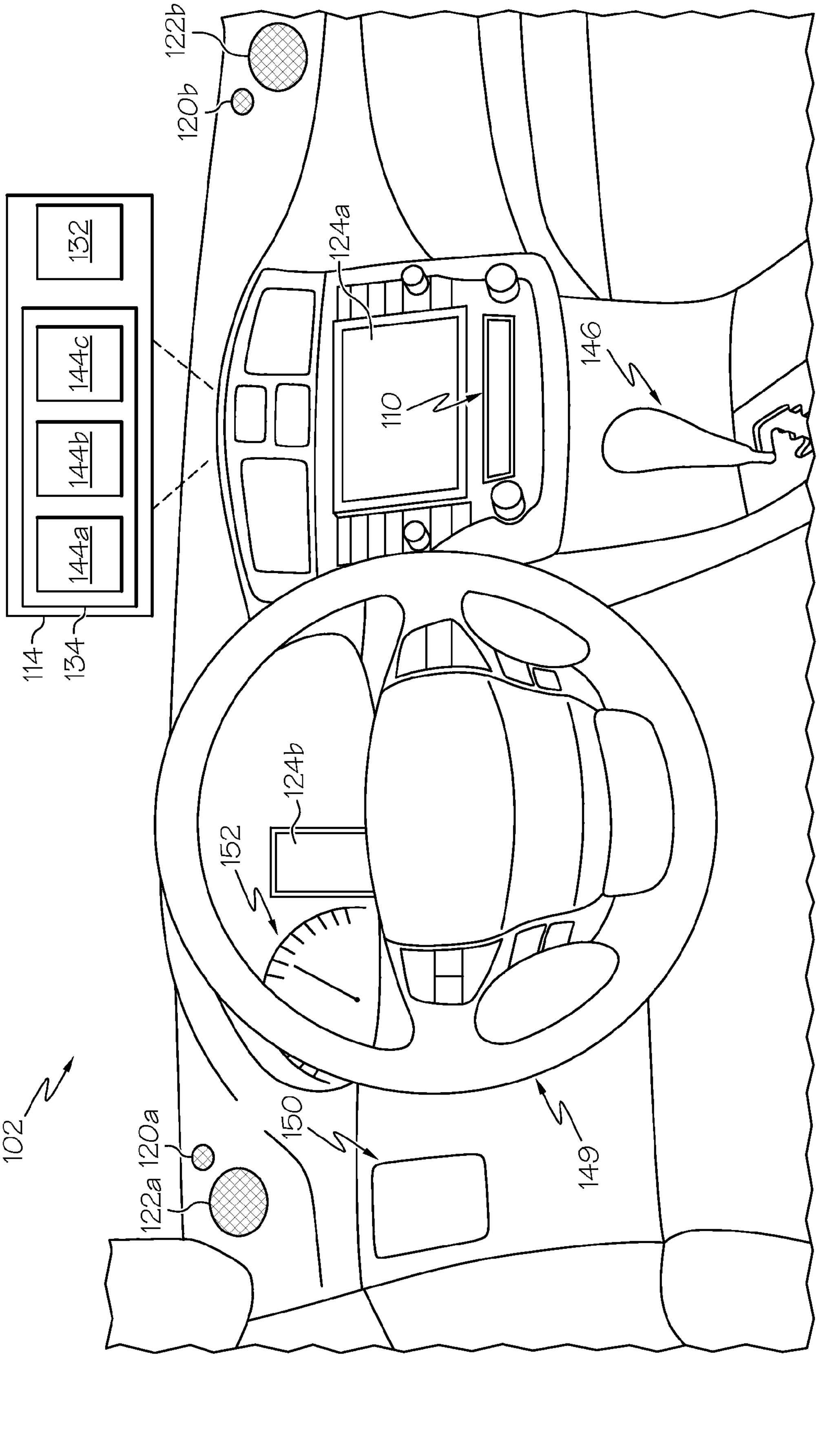
FIG. 1 schematically depicts a vehicle interior with a user display device for providing an abbreviated program guide, according to embodiments disclosed herein.

Referring now to the drawings, FIG. 1 schematically depicts an interior portion of a vehicle 102 with a display device 124 for providing an abbreviated program guide, according to embodiments disclosed herein. As illustrated, the vehicle 102 may include a console display 124*a* and a dash display 124*b* (referred to independently and/or collectively herein as "display device 124"). The console display 124*a* may be configured to provide one or more user interfaces and may be configured as a touch screen and/or include other features for receiving user input. The dash display 124*b* may similarly be configured to provide one or more interfaces, but often the data provided in the dash display 124*b* is a subset of the data provided by the console display 124*a*. Regardless, at least a portion of the user interfaces depicted and described herein may be provided on either or both the console display 124*a* and the dash display 124*b*.

Also included in the vehicle 102 is a content playback device 110, which may include a tape player, a compact disc player, a digital video disc player, a media file player, a radio signal receiver, a television signal receiver, an internet receiver, a navigation receiver, etc. The content playback device 110 may be operated via a touch screen of the display device 124, and/or one or more other inputs, such as on the dashboard and/or a steering wheel 148 of the vehicle 102. Also coupled to the content playback device 110 and/or display device 124 are one or more microphones 120*a*, 120*b* and one or more speakers 122*a*, 122*b*. The one or more microphones 120*a*, 120*b* may be configured for receiving user voice commands and/or other inputs. Similarly, the speakers 122*a*, 122*b* may be utilized for providing audio content from the content playback device 110 to the user. A gear shifter 146 may also be included for changing the operational state of the vehicle 102 (e.g., from a parking gear to a drive gear), as well as an emergency brake option 150 for engaging an emergency brake of the vehicle 102.

Figure 11:
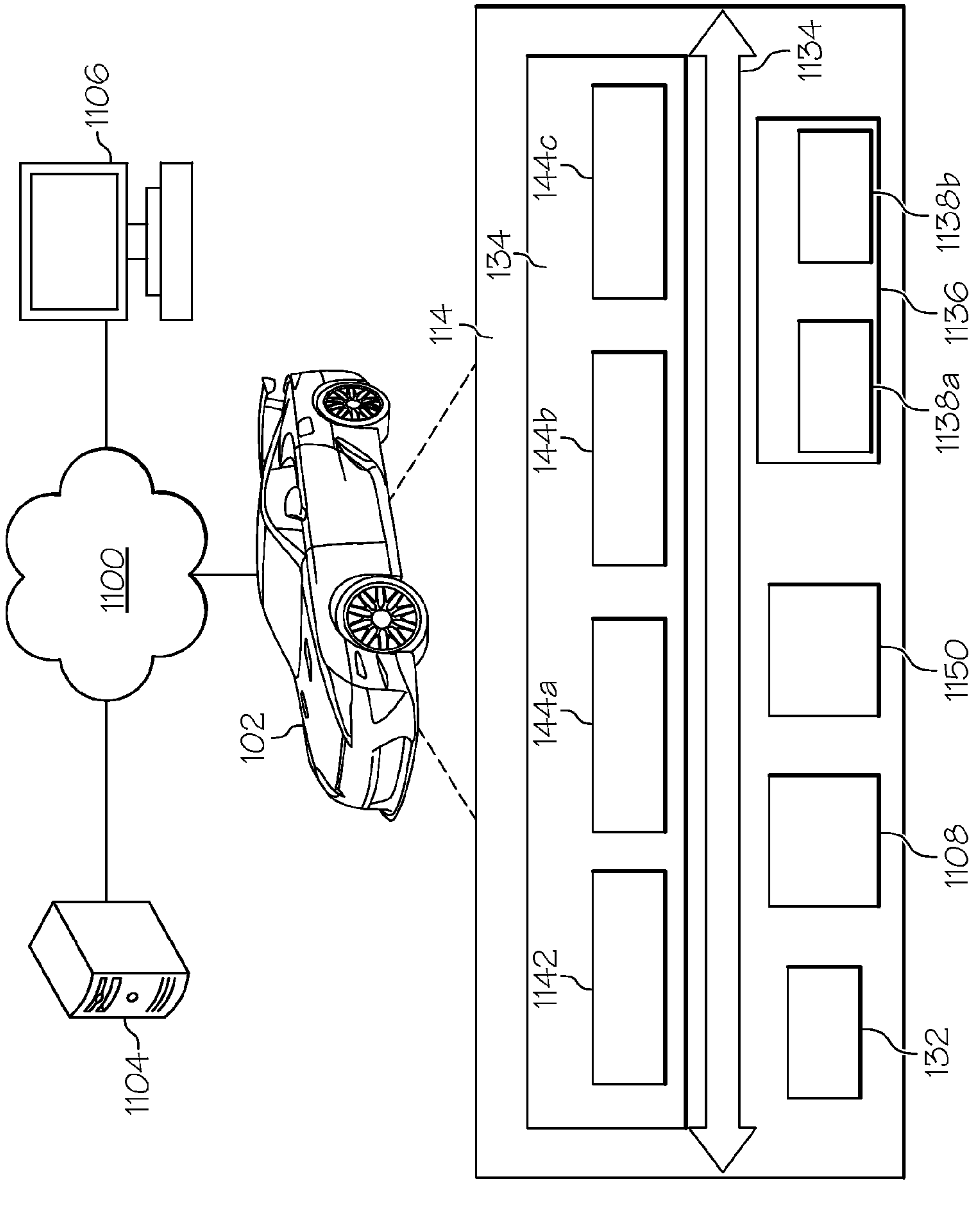
FIG. 11 depicts a network environment for providing the abbreviated electronic program guides, according to embodiments disclosed herein.

Also included in the vehicle 102 is a vehicle computing device 114. The vehicle computing device may be configured with a processor 132 and a memory component 134, which may store interface logic 144*a* and trigger logic 144*b*. The interface logic 144*a* and the trigger logic 144*b* may each include a plurality of different pieces of logic, each of which may be embodied as a computer program, firmware, and/or hardware, as an example. The interface logic 144*a* may be configured to cause the vehicle computing device 114 to provide a fully functional electronic program guide (EPG) and/or an abbreviated EPG each of which includes one or more interfaces, as described below. Similarly, the trigger logic 144*b* may be configured to cause the vehicle computing device 114 to determine when the vehicle 102 is in operation and when the vehicle 102 is not in operation, and trigger implementation of the fully functional EPG or the abbreviated EPG accordingly. Additional components of the vehicle are depicted in FIG. 11 and described in more detail below.

Figure 2:
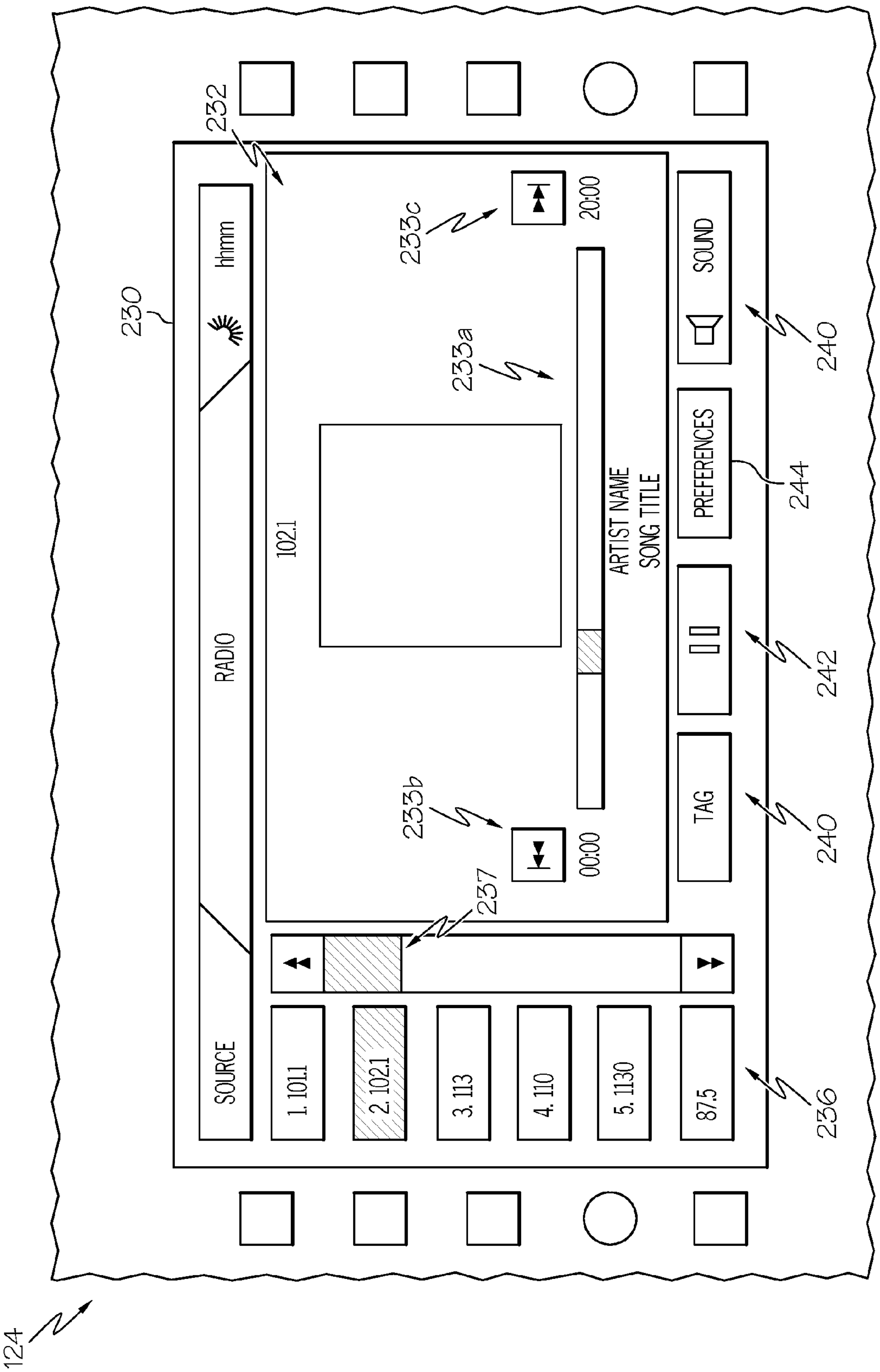
FIG. 2 depicts an in-vehicle user interface for providing audio options to the user of the vehicle, according to embodiments disclosed herein.

FIG. 2 depicts an in-vehicle user interface 230 for providing audio options to the user of the vehicle 102, according to embodiments disclosed herein. As illustrated, the display device 124 may provide one or more in-vehicle interfaces, as depicted in FIGS. 2-9. The in-vehicle interfaces may be provided based on user input and/or based on an operational state of the vehicle 102 and may include one or more options for controlling the content playback device 110. Specifically referring to FIG. 2, the in-vehicle user interface 230 may be provided when the vehicle is not operational and thus may be part of the fully functional EPG. Accordingly, the in-vehicle user interface 230 may include a "now playing" section 232, which provides information on the content that the content playback device 110 is currently playing. As discussed above, the vehicle 102 may be configured for playing stored audio, radio audio, internet audio, stored video, radio video, internet video, navigation data, and/or other content. Regardless, the in-vehicle user interface 230 may provide the content that is currently being played in the now playing section 232. The now playing section 232 may provide information on the currently playing content, as well as a progress meter 233*a*, a reverse option 233*b*, and a forward option 233*c*. The progress meter 233*a* may indicate the progress of the currently playing content. In response to a user selection of the reverse option 233*b*, previously played content may be again provided. In response to selection of the forward option 233*c*, the currently playing content may be skipped.

Also included is a channel section 236, which includes a listing of channels that may be selected for providing the content. As indicated via shading, channel 2 (102.1) is the currently selected channel. The user may select other channels in the channel section 236. If the desired channel is not provided in the in-vehicle user interface 230, the user may select a scroll option 237 to view additional channels. A sources option 238 is also included for providing options for selecting other sources of content, such as the compact disc player, digital video disc player, the media file player, the satellite radio player, the internet radio player, the navigation system etc.

The in-vehicle user interface 230 may also include a tag option 240, a pause option 242, a preferences option 244, and a sound option 246. In response to selection of the tag option 240, the currently playing content may be tagged for later playback. This may include identifying that the currently playing content is a preferred piece of content such that future determinations of channels and content may be more easily made.

Similarly, in response to the pause option 242, the currently playing content may be paused and buffered for resuming at a future time. As an example, if the currently playing content is received from a radio signal, the vehicle computing device 114 may begin recording the received signal. Additionally, the vehicle computing device 114 may pause playback of the currently playing content. When the pause option 242 is selected again, the vehicle computing device 114 may access the recorded signal to resume playback.

In response to selection of the preferences option 244, additional options may be provided, as described in more detail below. Similarly, in response to selection of the sound option 246, one or more sound related settings may be provided. The sound settings may include volume equalizer settings, bass settings, treble settings, balance settings, etc. Other sound related settings may also be provided.

Specifically, the vehicle 102 may receive a media signal, such as an internet signal, a television signal, a radio signal, (which may include a terrestrial radio signal, a satellite radio signal, etc.), etc. Regardless, the media signal may include a content portion and an auxiliary information display portion. The content portion may include the audio and/or video that is played in the vehicle 102. The auxiliary information display portion may provide information related to the content that is being received, such as title, artist name, album title, etc. Accordingly, the content portion may be provided for display, such as through the speaker 122 (FIG. 1), while the auxiliary information display portion may be provided via the display device 124 (also FIG. 1), as depicted in the in-vehicle user interface 230.

In response to selection of the preferences option 244 in FIG. 2, the vehicle computing device 114 may determine whether the vehicle 102 is in operation. Specifically, the vehicle computing device 114 may utilize a gear sensor in the gear shifter 146 (FIG. 1) to determine whether the vehicle 102 is currently in gear. Similarly, in some embodiments, if the vehicle 102 includes a manual transmission, the vehicle computing device 114 may utilize an emergency brake sensor associated with the emergency brake option 150 (also FIG. 1) to determine whether a vehicle emergency brake is engaged and/or whether a foot break has been engaged. The vehicle computing device 114 may, in some embodiments, utilize the speedometer 152 (FIG. 1) to determine the current speed of the vehicle 102. If the current speed of the vehicle is below a predetermined threshold, the vehicle 102 is considered to be not in operation. Regardless, in response to determining that the vehicle 102 is not in operation, a fully functional EPG, as depicted in FIGS. 3-7.

Figure 3:
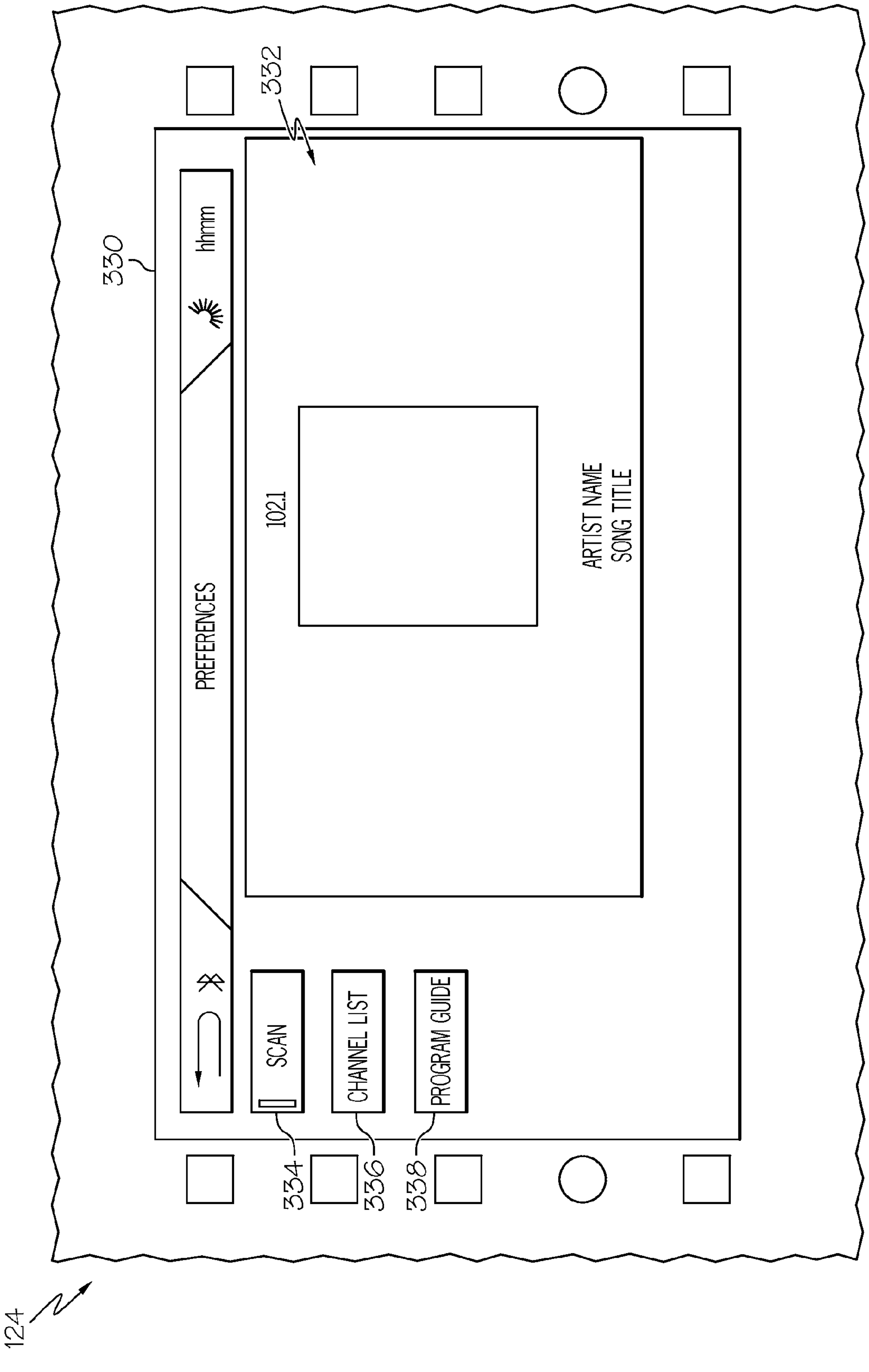
FIG. 3 depicts an in-vehicle user interface for providing a fully functional electronic program guide when the vehicle is not in operation, according to embodiments disclosed herein.

FIG. 3 depicts an in-vehicle user interface 330 for providing a fully functional electronic program guide when the vehicle 102 is not in operation, according to embodiments disclosed herein. In response to selection of the preferences option 244 from FIG. 2 and a determination that the vehicle 102 is not in operation, the in-vehicle user interface 330 may be provided. The in-vehicle user interface 330 may include a source section 332, which may provide information on the currently playing content. The information provided in the source section 332 may include a channel identifier, an artist name, a song title, and/or other information. Also included in the in-vehicle user interface 330 are a scan option 334, a channel list option 336, and a program guide option 338. In response to selection of the scan option 334, the channels may be scanned for locating different content. In response to selection of the channel list option 336, a visual listing of channels for the selected source may be provided, as described in more detail below. In response to selection of the program guide option 338, the fully functional EPG user interface may be provided, as also described below with reference to FIG. 4.

As illustrated, when the vehicle 102 is not in operation, the user may be provided will all available options of a fully functional EPG. Accordingly, in response to selection of the program guide option 338, the fully functional EPG may be provided.

Figure 4:
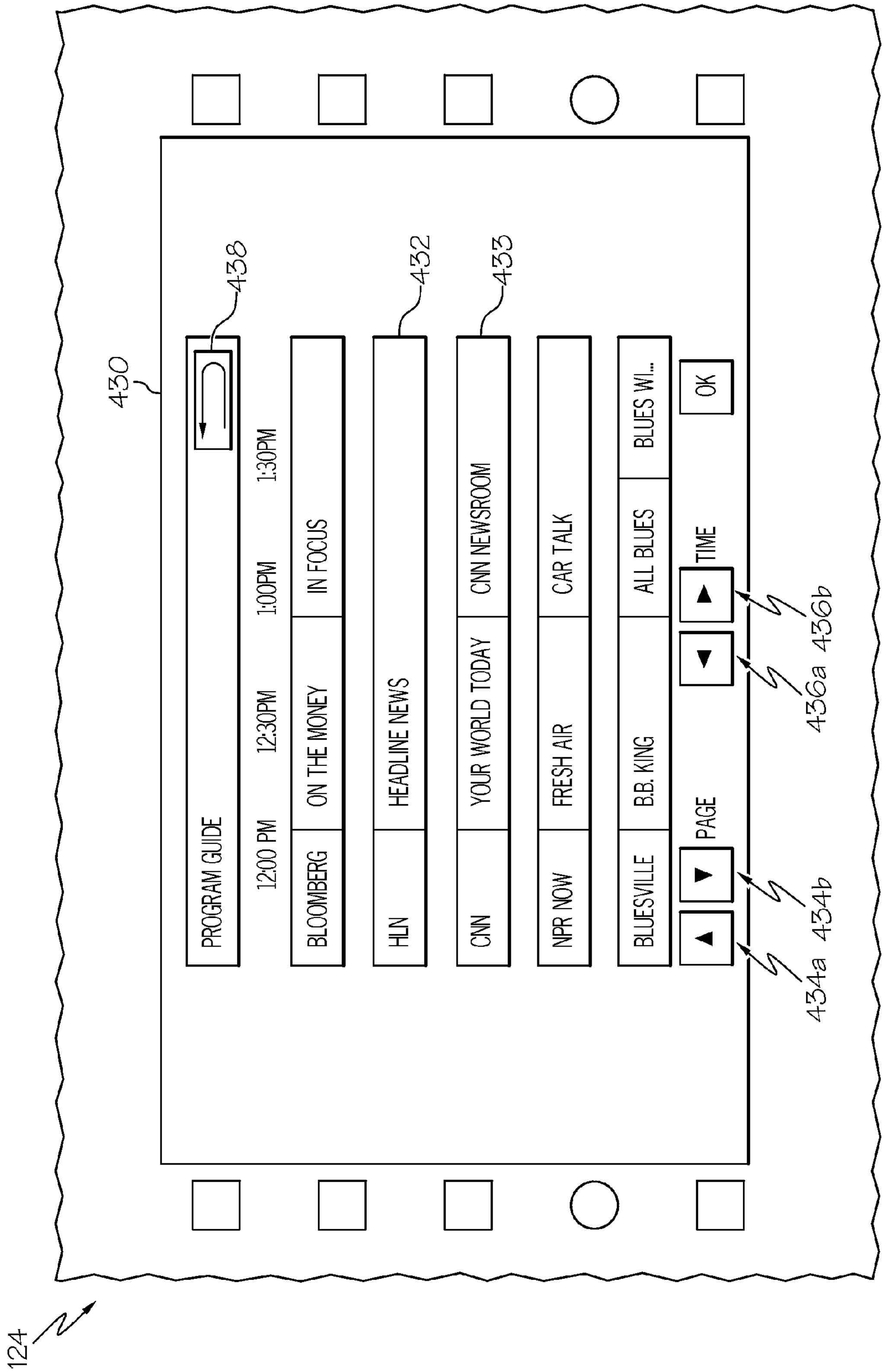
FIG. 4 depicts another in-vehicle user interface of the fully functional electronic program guide when the vehicle is not in operation, according to embodiments disclosed herein.
Figure 5:
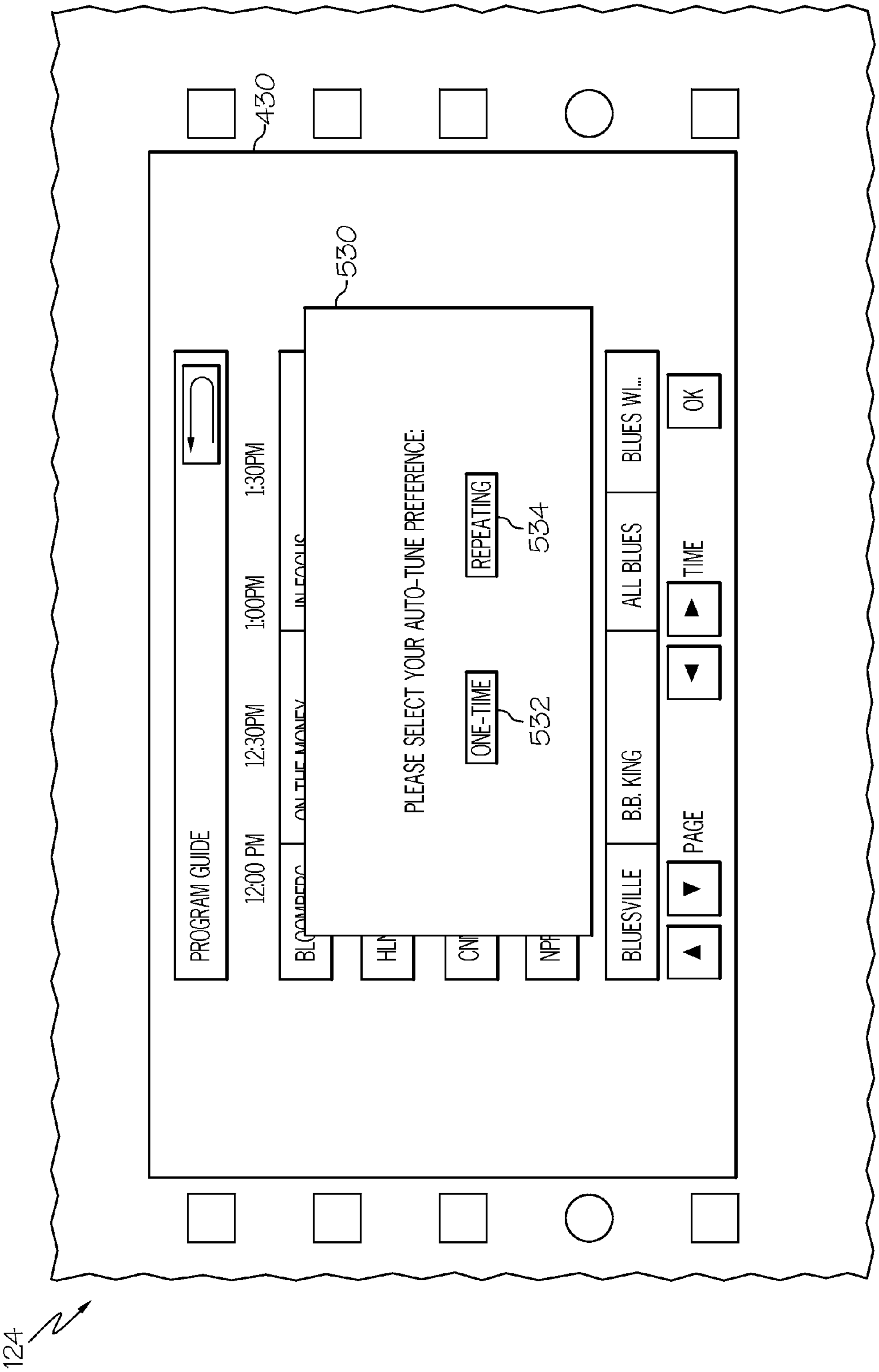
FIG. 5 depicts an in-vehicle user interface for providing an auto-tune option when the vehicle is not in operation, according to embodiments disclosed herein.

FIG. 4 depicts an in-vehicle user interface 430 of the fully functional electronic program guide when the vehicle 102 is not in operation, according to embodiments disclosed herein. In response to selection of the program guide option 338 in FIG. 3, the in-vehicle user interface 430 may be provided. Specifically, the in-vehicle user interface 430 may be configured to provide a fully functional EPG that includes scheduled programming for a plurality of audio (and/or video) channels over a plurality of different times. The vehicle user may select one or more of the programs for providing the content, recording the content, and/or for providing additional information on the content. As an example, in response to selection of a "Headline News" option 432, the content playback device 110 may tune to the corresponding channel. However, in response to selection of a "CNN Newsroom" option 433, the vehicle computing device 114 may provide an in-vehicle user interface 530 as depicted in FIG. 5 and described in more detail, below. Also included are page scroll options 434*a*, 434*b* for scrolling different channels, time scroll options 436*a*, 436*b* for scrolling different times, and a return option 438 to return to the in-vehicle user interface 330 from FIG. 3.

As illustrated in the in-vehicle user interface 430 of FIG. 4, because the vehicle 102 is not in operation, the fully functional EPG may be provided. The fully functional EPG may include a plurality of options for controlling the display device 124 and/or the content playback device 110. As an example, the user may initiate an auto-tune option for scheduling tuning of the content playback device 110 at a predetermined future time.

FIG. 5 depicts an in-vehicle user interface 530 for providing auto-tune functionality when the vehicle 102 is not in operation, according to embodiments disclosed herein. In response to selection of the CNN Newsroom option 434 from FIG. 4, the in-vehicle user interface 530 may be provided. Specifically, because the CNN newsroom option 434 from FIG. 4 identifies a program that is scheduled for the future, the auto-tune functionality may be implemented. As a consequence, the in-vehicle user interface 530 may provide one or more auto-tune options, such as a one-time auto-tune option 532 and a repeating auto-tune option 534. The auto-tune options 532, 534 may be configured to schedule tuning and/or a channel change of the radio to a predetermined channel and/or future program at a predetermined time, based on the program guide information.

Specifically, if the vehicle 102 is not in operation, the user may be provided with the full EPG, as depicted in FIGS. 2-4. During this time, the user may identify other programs and/or channels that the user wishes to view. The user may then activate the auto-tune functionality by selecting a future program depicted in the fully functional EPG. The one-time auto-tune option 532 may be provided for scheduling a single occurrence. The repeating auto-tune option 534 may be utilized for scheduling repeated instances of that program for tuning. Thus, if at the time of the scheduled program, the vehicle 102 is in operation, the auto-tune functionality may automatically tune the content playback device 110 to the preselected channel for viewing.

Figure 6:
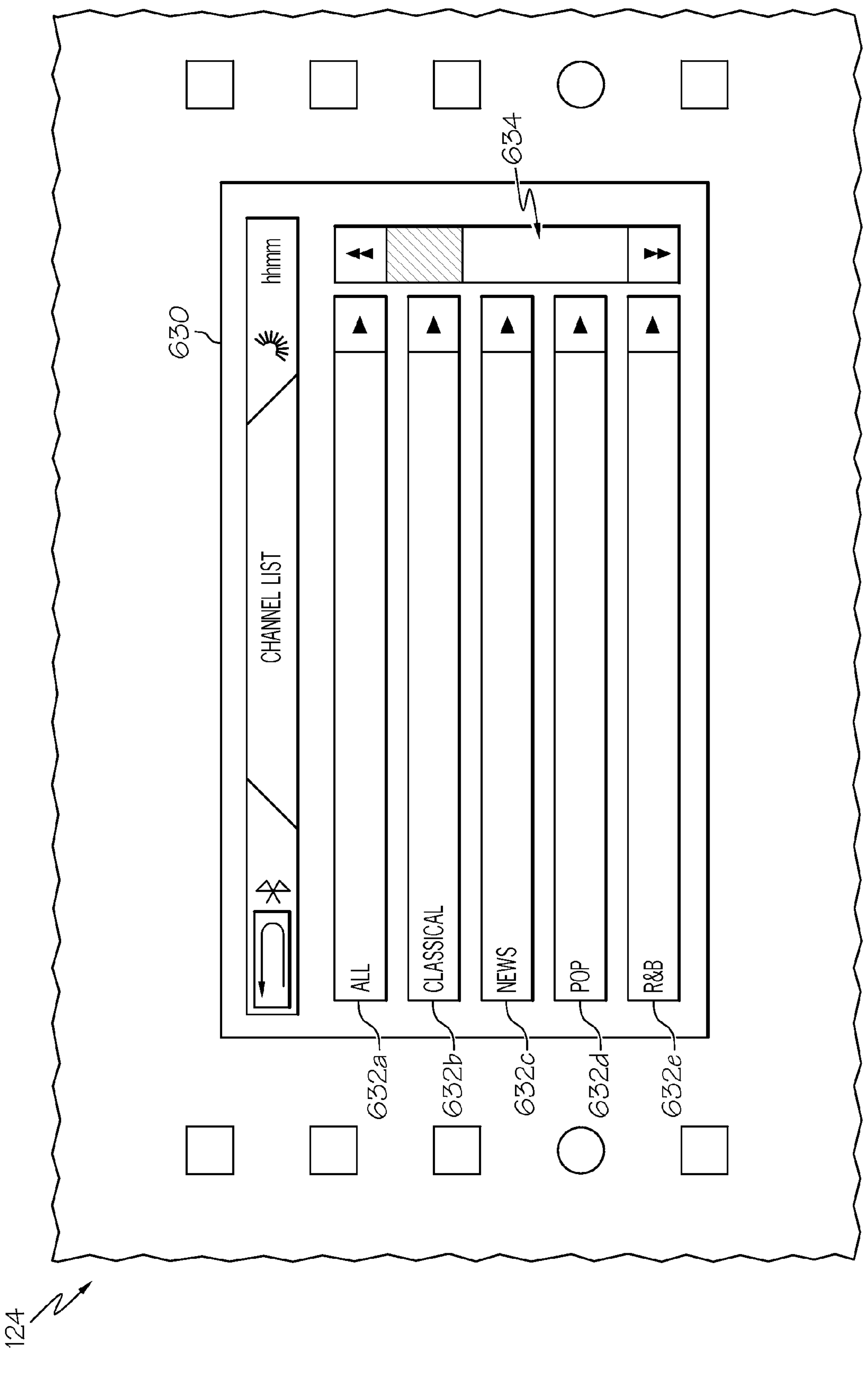
FIG. 6 depicts an in-vehicle user interface for providing a channel list, when the vehicle is not in operation, according to embodiments disclosed herein.

FIG. 6 depicts an in-vehicle user interface 630 for providing a channel list when the vehicle 102 is not in operation, as part of a fully functional EPG, according to embodiments disclosed herein. In response to selection of the channel list option 336 from FIG. 3, the in-vehicle user interface 630 may be provided. Specifically, the in-vehicle user interface 630 may include a listing of one or more channels that may be available to the vehicle user. The one or more channels may include satellite radio channels, terrestrial radio channels, internet radio channels, and/or other mediums for programming. Additionally included are an all option 632*a* for viewing information on all available channels, a classical option 632*b* for viewing information on classical channels, a news option 632*c* for viewing information on news channels, and an R&B option for viewing information on R&B channels. Other channel options may also be provided by scrolling down using a scroll option 634.

Figure 7:
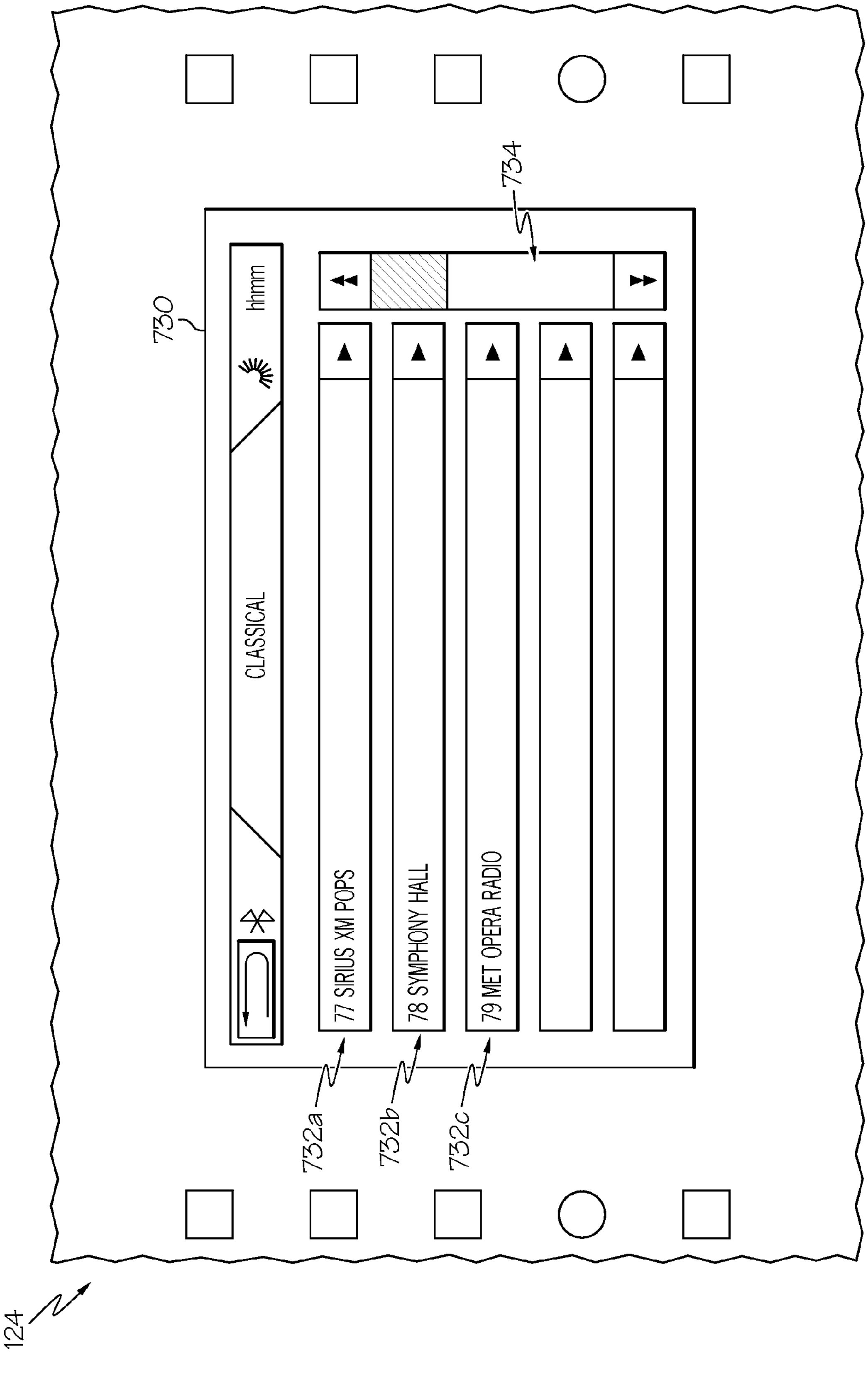
FIG. 7 depicts an in-vehicle user interface for providing a category of media to a user as part of a fully functional electronic program guide when the vehicle is not in operation, according to embodiments disclosed herein.

FIG. 7 depicts an in-vehicle user interface 730 as part of a fully functional EPG for providing a category of media to a user when the vehicle 102 is not in operation, according to embodiments disclosed herein. In response to selection of the classical option 632*b* from FIG. 6, the in-vehicle user interface 730 may be provided. The in-vehicle user interface 730 may provide a listing of the channels that correspond to the selected category from FIG. 6. Selection of the channel may change the currently playing channel for the vehicle 102. Additional channels may be provided via selection of a scroll option 734.

It should be understood that the user interfaces depicted in FIGS. 3-7 may be provided in response to a determination that the vehicle 102 is not in operation. However, the user interfaces depicted in FIGS. 8-9 may be provided as part of an abbreviated EPG. The abbreviated EPG may be provided in response to a determination that the vehicle 102 is in operation. As discussed above, the vehicle 102 may be considered in an operational state if the vehicle 102 has engaged in a gear, if a parking brake is not engaged, if an emergency brake is not engaged, if a vehicle speed is above a predetermined threshold, if the vehicle 102 is located at a predetermined geographic location, and/or based on other criteria. Regardless, from the in-vehicle user interface 230 from FIG. 2, if the vehicle computing device 114 determines that the vehicle 102 is in an operational state, an abbreviated user interface may be provided.

Specifically, once the determination is made that the vehicle 102 is in an operational state, a portion of the auxiliary information (such as user options) of the media portion may be removed from the received media signal. Additionally, the content portion of the received media signal may be provided via the vehicle 102 for playback. The altered auxiliary information, which includes a subset of the total auxiliary information, may be provided on the display device 124, as described with reference to FIGS. 8 and 9, below.

Figure 8:
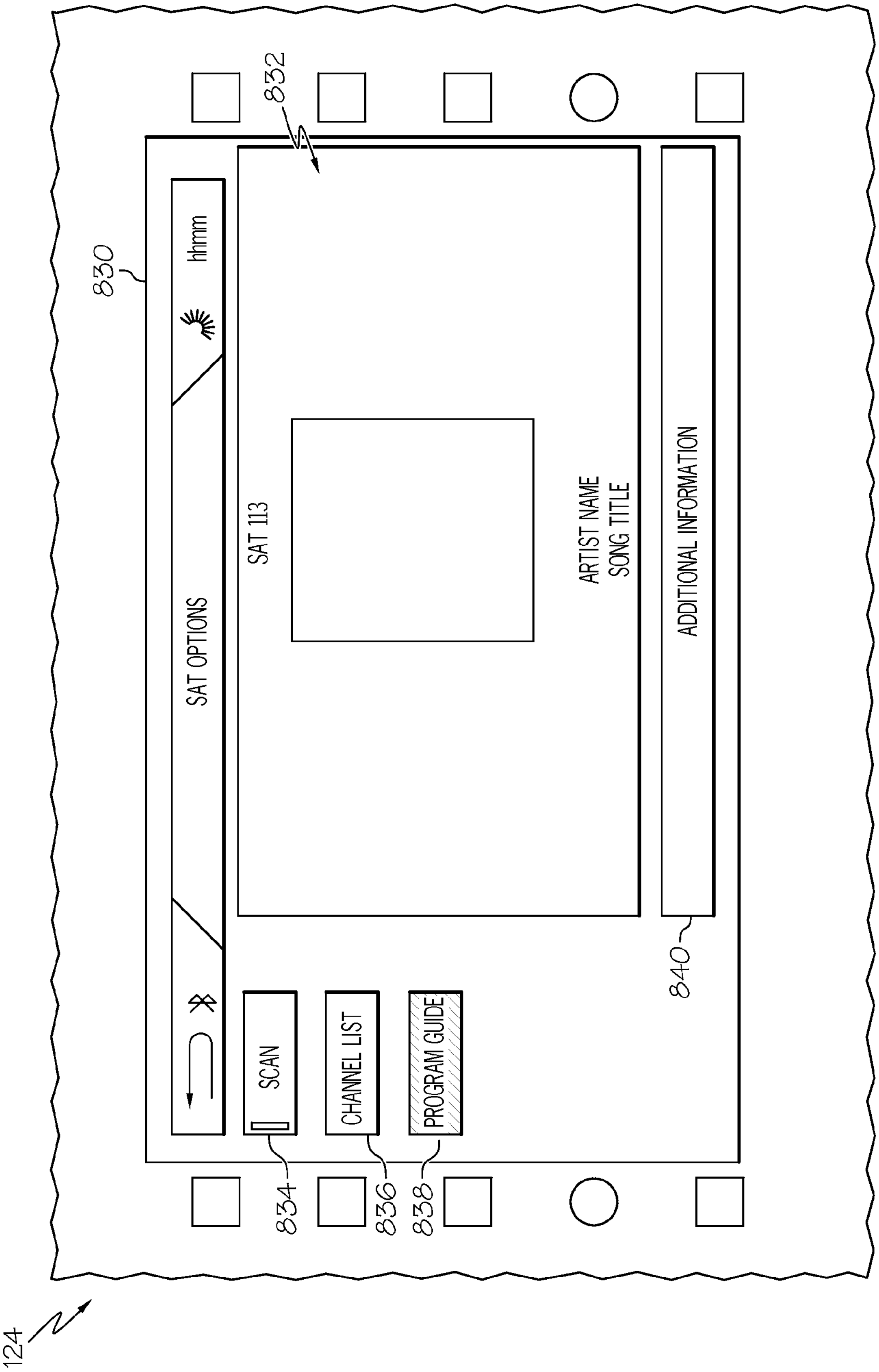
FIG. 8 depicts an abbreviated in-vehicle user interface as part of an abbreviated electronic program guide when the vehicle is in operation, according to embodiments disclosed herein.

FIG. 8 depicts an abbreviated in-vehicle user interface 830 as part of an abbreviated EPG when the vehicle 102 is in operation, according to embodiments disclosed herein. As illustrated, the abbreviated in-vehicle user interface 830 may include a source section 832, a scan option 834, a channel list option 836, a program guide option 838, and an additional information option 840. Similar to the options depicted in FIG. 2, the scan option 834 may allow for the scanning of channels that are received by the content playback device 110. The channel list option 836 may provide the vehicle 102 user with a listing of channels that the vehicle receives, as depicted din FIG. 9. However, while the in-vehicle user interface 630 in FIG. 6 depicts a program guide option 638, the program guide option 838 in FIG. 8 is an unselectable option because the vehicle 102 is in operation. Additionally, the abbreviated in-vehicle user interface 830 includes the additional information option 840 for providing an abbreviated program guide, as described in more detail below.

As discussed above, because the vehicle 102 is determined to be in an operational state, the abbreviated EPG may be provided. As a consequence, additional options described with regard to FIGS. 3-7 may not be provided. However, as the user has access to the auto-tune functionality described above, future programs may be scheduled while the vehicle 102 is not in operation and provided while the vehicle 102 is in operation.

Figure 9:
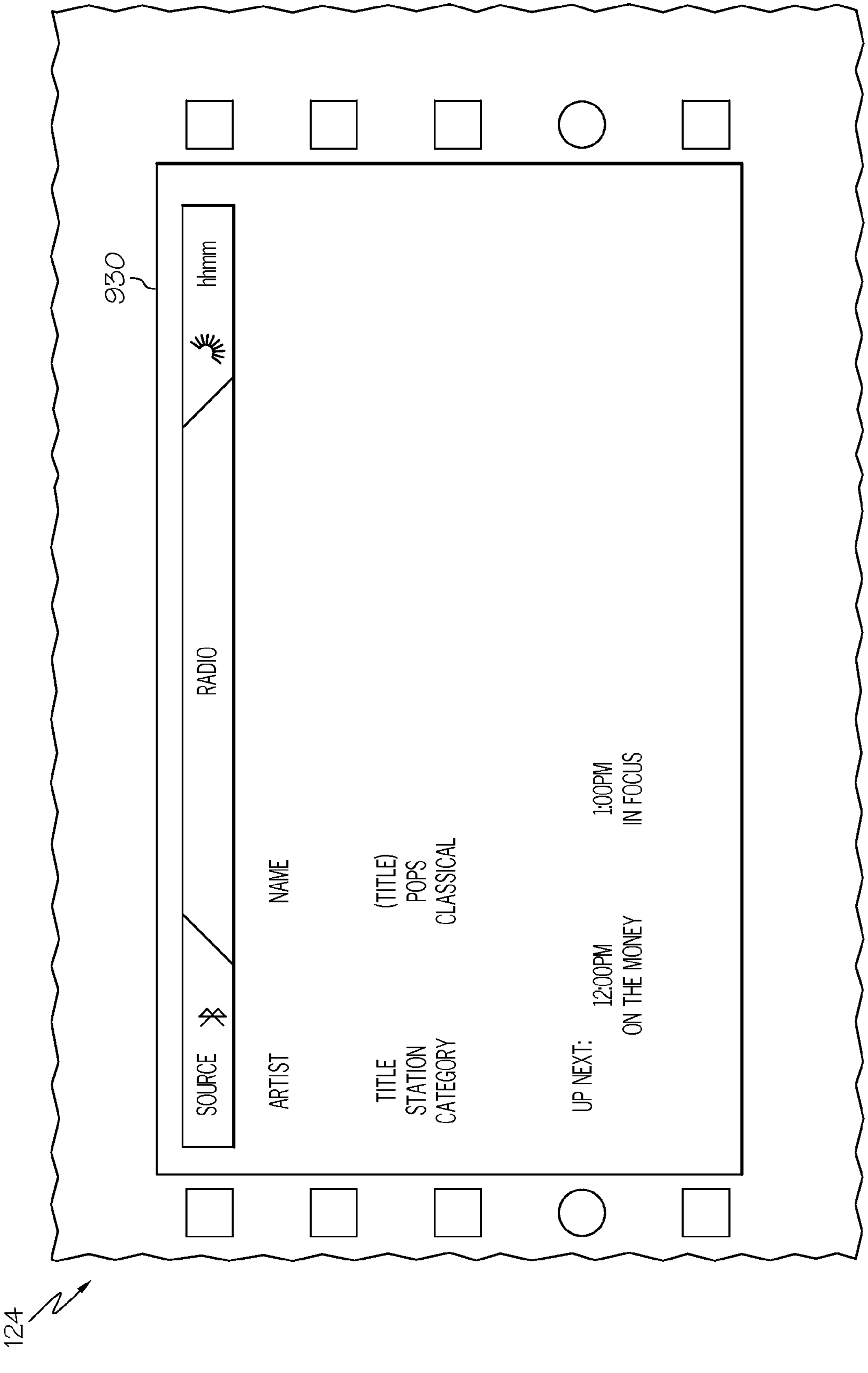
FIG. 9 depicts another abbreviated in-vehicle user interface for providing additional information to the user when the vehicle is in operation, according to embodiments disclosed herein.

FIG. 9 depicts another abbreviated in-vehicle user interface 930 for providing additional information to the user when the vehicle 102 is in operation, according to embodiments disclosed herein. In response to selection of the additional information option 840 from FIG. 8, the abbreviated in-vehicle user interface 930 may be provided. Specifically, because the vehicle computing device 114 detected that the vehicle 102 is in operation, the abbreviated in-vehicle user interface 830 of FIG. 8 is provided to streamline the number of options provided to the vehicle driver.

Accordingly, the abbreviated in-vehicle user interface 930 includes a subset of the information provided to the vehicle user when the vehicle 102 is not in operation. Specifically, instead of a full EPG, as depicted in FIGS. 4 and 5, the abbreviated in-vehicle user interface 930 may only include information, such as an artist name, content title, station, category, and a subset of future programming (such as a next title, a previously scheduled auto-tune selection, etc.) on the current channel. The options provided in FIGS. 3-7 may not be accessible when the vehicle 102 is in operation. Accordingly, the vehicle user may be provided with a streamlined console for operating the vehicle 102.

It should be understood that while the abbreviated in-vehicle user interface 930 of FIG. 9 is depicted as providing the artist name, title, station, category and future programming, this is merely an example. Specifically, the abbreviated in-vehicle user interface 930 may include any information, which is a subset of the information provided when the vehicle 102 is not in operation. This may include providing abbreviated versions of the in-vehicle user interfaces 630 of FIG. 6 and/or 730 of FIG. 7, among others. Additionally, depending on the particular embodiment, selections may be unavailable to the user when the vehicle 102 is in operation.

It should also be understood that in some embodiments, the display device 124 may provide any of the in-vehicle user interfaces 330-730 (FIGS. 3-7) when the vehicle 102 is not in operation. As such, the vehicle 102 may become operational while the display device 124 is providing any of the in-vehicle user interfaces 330-730 (FIGS. 3-7). Thus, when the vehicle 102 becomes operational, the vehicle computing device 114 may automatically revert to the abbreviated in-vehicle user interface 830 or 930, based on the particular embodiment. Other abbreviated in-vehicle user interfaces may be provided, based on the particular embodiment.

Figure 10:
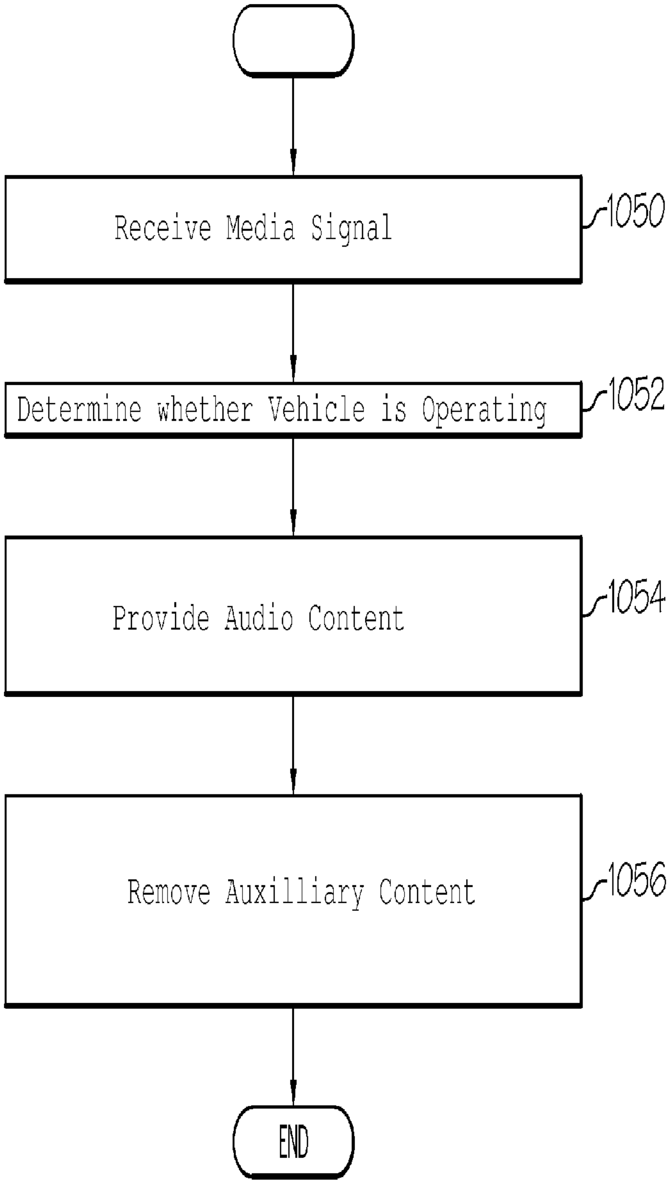
FIG. 10 depicts a flowchart for providing a user interface with a subset of features of a full user interface when the vehicle is not in operation, according to embodiments disclosed herein.

FIG. 10 depicts a flowchart for providing a user interface with a subset of features of a full user interface when the vehicle 102 is not in operation, according to embodiments disclosed herein. As illustrated in block 1050, a media signal may be received via the content playback device 110 and/or vehicle computing device 114. The media signal may include an audio content portion and an auxiliary information display portion. In block 1052, a determination may be made regarding whether the vehicle 102 is in operation. In block 1054, in response to determining that the vehicle 102 is not in operation, the audio content portion may be provided for playback in the vehicle 102 an the auxiliary information display portion may be provided for display in the vehicle 102. In block 1056, in response to determining that the vehicle 102 is in operation the auxiliary information display portion may be altered to remove content form the auxiliary information display portion. Additionally, the audio content portion may be provided for playback in the vehicle 102. The altered auxiliary display portion information may be provided for display in the vehicle 102, where the altered auxiliary information includes only a subset of features from the unaltered auxiliary information display portion.

FIG. 11 depicts a network environment for providing the abbreviated electronic program guides described above, according to embodiments disclosed herein. The vehicle 102 is depicted in FIG. 11 as an automobile but may be any passenger or non-passenger vehicle such as, for example, a terrestrial, aquatic, and/or airborne vehicle. The vehicle 102 may be coupled to a remote computing device 1104 and/or a user computing device 1106 for receiving content and/or other data via a network 1100. The network may include a wide area network, local area network, and/or other wired or wireless network for communicating data, as described herein.

Also illustrated is the vehicle computing device 114, which includes the processor 132, input/output hardware 1108, the network interface hardware 1150, a data storage component 1136 (which stores routing 238*a*, user data 238*b*, and/or other data), and the memory component 134. The memory component 134 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the vehicle computing device 114 and/or external to the vehicle computing device 114.

The memory component 134 may store operating logic 1142, the interface logic 144*a* and the trigger logic 144*b*. The interface logic 144*a* and the trigger logic 144*b* may each include a plurality of different pieces of logic, each of which may be embodied as a computer program, firmware, and/or hardware, as an example. A local interface 1134 is also included in FIG. 11 and may be implemented as a bus or other communication interface to facilitate communication among the components of the vehicle computing device 114.

The processor 132 may include any processing component operable to receive and execute instructions (such as from a data storage component 1136 and/or the memory component 134). As described above, the input/output hardware 1108 may include and/or be configured to interface with the components of FIG. 11. As an example, the input/output hardware 1108 may include the microphones 120, the speaker 122, the display device 124, the gear shifter 146, emergency brake option 150, the speedometer 152, and/or other hardware in the vehicle 102

The network interface hardware 1150 may include and/or be configured for communicating with any wired or wireless networking hardware, including an antenna, a modem, LAN port, wireless fidelity (Wi-Fi) card, WiMax card, mobile communications hardware, and/or other hardware for communicating with other networks and/or devices. From this connection, communication may be facilitated between the vehicle computing device 114 and other computing devices.

The operating logic 1142 may include an operating system and/or other software for managing components of the vehicle computing device 114. Similarly, as discussed above, the interface logic 144*a* may reside in the memory component 134 and may be configured to cause the processor 132 to provide one or more of the user interfaces described herein. Similarly, the trigger logic 144*b* may be utilized to determine the triggering action for implementing abbreviated user interfaces, as described herein.

It should be understood that while the components in FIG. 11 are illustrated as residing within the vehicle computing device 114, this is merely an example. In some embodiments, one or more of the components may reside external to the vehicle computing device 114. It should also be understood that, while the vehicle computing device 114 in FIG. 1 is illustrated as a single device, this is also merely an example. In some embodiments, the interface logic 244*a* and the trigger logic 244*b* may reside on different computing devices. As an example, one or more of the functionality and/or components described herein may be provided by a remote computing device 1104 and/or user computing device 1106, which may be coupled to the vehicle 102 via a network 1100, which may be embodied as a wide area network and/or local area network.

Additionally, while the vehicle computing device 114 is illustrated with the interface logic 144*a* and the trigger logic 144*b* as separate logical components, this is also an example. In some embodiments, a single piece of logic may cause the vehicle computing device 114 to provide the described functionality.

As illustrated above, various embodiments of an abbreviated electronic program guide are disclosed. Specifically, by providing an abbreviated electronic program guide, only desired information may be provided to the vehicle user, thereby reducing the number of options for the vehicle 102. This streamlines the interaction between the vehicle 102 and vehicle operator.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

What is claimed is:

1. A method for providing an abbreviated electronic program guide, comprising:

receiving, via a vehicle, a radio signal, the radio signal including an audio content portion and an auxiliary information display portion;

determining whether the vehicle is in operation;

in response to determining that the vehicle is not in operation, providing the audio content portion for playback in the vehicle, providing the auxiliary information display portion for display in the vehicle, providing a user interface with an option to auto-tune a user specified program, and receiving a user input designating the user-specified program; and in response to determining that the vehicle is in operation:

creating an altered auxiliary information by removing content from the auxiliary information display portion;

providing the audio content portion for playback in the vehicle;

providing the altered auxiliary information for display in the vehicle, wherein the altered auxiliary information includes a subset of features from the auxiliary information display portion;

providing the user interface without the option to auto-tune the user specified program; and determining whether the user-specified program is being broadcast and, in response to determining that the user-specified program is being broadcast, automatically tuning to a channel that is broadcasting the user specified program.

2. The method of claim 1, further comprising, in response to determining that the vehicle is currently in use, providing an in-vehicle user interface with an unselectable option that is otherwise selectable when the vehicle is not in operation.

3. The method of claim 1, wherein providing the altered auxiliary information comprises providing an in-vehicle user interface that provides at least one of the following: an artist name, a content title, a station, a category, and a next title.

4. The method of claim 1, wherein determining whether the vehicle is in operation comprises determining at least one of the following: whether a parking brake is engaged, whether an emergency brake is engaged, whether a gear of the vehicle is engaged, a geographic location of the vehicle, and whether the vehicle is traveling at a speed that meets a predetermined threshold.

5. The method of claim 1, further comprising, in response to determining that the vehicle is in operation, disabling receipt of user input.

6. A system for providing an abbreviated electronic program guide comprising:

a memory component that stores logic that causes the system to perform at least the following:

receive a media signal at a vehicle, the media signal including an audio content portion and an auxiliary information display portion;

determine whether the vehicle is in operation;

in response to determining that the vehicle is not in operation, provide the audio content portion for playback in the vehicle, provide the auxiliary information display portion for display in the vehicle, provide a user interface with an option to auto-tune a user specified program, and receive a user input designating the user-specified program; and in response to determining that the vehicle is in operation:

create altered auxiliary information by removing content from the auxiliary information display portion;

provide the audio content portion for playback in the vehicle; and provide the altered auxiliary information for display a display device;

provide the user interface without the option to auto-tune the user specified program; and determine whether the user-specified program is being broadcast and, in response to determining that the user-specified program is being broadcast, automatically tuning to a channel that is broadcasting the user specified program.

7. The system of claim 6, wherein, in response to determining that the vehicle is currently in use, the logic further causes the system to provide an in-vehicle user interface with an unselectable option that is otherwise selectable when the vehicle is not in operation.

8. The system of claim 6, wherein providing the altered auxiliary information comprises providing an in-vehicle user interface that provides at least one of the following: an artist name, a content title, a station, a category, and a next title.

9. The system of claim 6, wherein determining whether the vehicle is in operation comprises determining at least one of the following: whether a parking brake is engaged, whether an emergency brake is engaged, whether a gear of the vehicle is engaged, a geographic location of the vehicle, and whether the vehicle is traveling at a speed that meets a predetermined threshold.

10. The system of claim 6, wherein, in response to determining that the vehicle is in operation, the logic further causes the system to disable receipt of user input.

11. A vehicle for providing an abbreviated electronic program guide comprising:

a display device; and a vehicle computing device that is coupled to the display device and stores logic that causes the vehicle computing device to perform at least the following:

provide a user interface with an option to auto-tune a user specified program;

receive a user input designating the user-specified program;

receive a media signal, the media signal including an audio content portion and an auxiliary information display portion;

determine whether the vehicle is in operation; and in response to determining that the vehicle is in operation:

create altered auxiliary information by removing content from the auxiliary information display portion;

provide the audio content portion for playback in the vehicle;

provide the altered auxiliary information to the display device for display on the display device:

provide the user interface without the option to auto-tune the user specified program; and determine whether the user-specified program is being broadcast and, in response to determining that the user-specified program is being broadcast, automatically tuning to a channel that is broadcasting the user specified program.

12. The vehicle of claim 11, wherein, in response to determining that the vehicle is currently in use, the logic further causes the vehicle computing device to provide an in-vehicle user interface with an unselectable option that is otherwise selectable when the vehicle is not in operation.

13. The vehicle of claim 11, wherein providing the altered auxiliary information comprises providing an in-vehicle user interface that provides at least one of the following: an artist name, a content title, a station, a category, and a next title.

14. The vehicle of claim 11, wherein determining whether the vehicle is in operation comprises determining at least one of the following: whether a parking brake is engaged, whether an emergency brake is engaged, whether a gear of the vehicle is engaged, a geographic location of the vehicle, and whether the vehicle is traveling at a speed that meets a predetermined threshold.

15. The vehicle of claim 11, wherein, in response to determining that the vehicle is in operation, the logic further causes the vehicle computing device to disable receipt of user input.

* * * * *